United States Patent
Rhe et al.

(10) Patent No.: US 12,386,444 B2
(45) Date of Patent: Aug. 12, 2025

(54) DISPLAY DEVICE WITH MULTI-RESOLUTION

(71) Applicant: LG Display Co., Ltd., Seoul (KR)

(72) Inventors: Ruda Rhe, Paju-si (KR); JiHyun Jung, Paju-si (KR); DeukSu Lee, Paju-si (KR); SuChang An, Paju-si (KR); JaeGyun Lee, Paju-si (KR); Hyangmyoung Gwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 545 days.

(21) Appl. No.: 17/843,793

(22) Filed: Jun. 17, 2022

(65) Prior Publication Data
US 2023/0006183 A1    Jan. 5, 2023

(30) Foreign Application Priority Data
Jun. 30, 2021  (KR) .................. 10-2021-0085398

(51) Int. Cl.
| | |
|---|---|
| *G06F 3/041* | (2006.01) |
| *G06F 3/044* | (2006.01) |
| *H10K 50/84* | (2023.01) |
| *H10K 50/86* | (2023.01) |
| *H10K 59/38* | (2023.01) |

(Continued)

(52) U.S. Cl.
CPC .......... *G06F 3/0412* (2013.01); *G06F 3/0446* (2019.05); *H10K 50/84* (2023.02); *H10K 50/865* (2023.02); *H10K 59/38* (2023.02); *H10K 59/40* (2023.02); *H10K 59/60* (2023.02); *H10K 59/87* (2023.02); *H10K 59/8792* (2023.02); *H10K 59/65* (2023.02); *H10K 59/873* (2023.02)

(58) Field of Classification Search
CPC .... H10K 50/865; H10K 59/40; H10K 59/122; H10K 59/126; H10K 59/8792
See application file for complete search history.

(56) References Cited

U.S. PATENT DOCUMENTS

| | | |
|---|---|---|
| 11,437,458 B2 | 9/2022 | Chung et al. |
| 11,706,953 B2 | 7/2023 | Chung et al. |

(Continued)

FOREIGN PATENT DOCUMENTS

| | | |
|---|---|---|
| CN | 113035910 A | 6/2021 |
| KR | 10-2020-0039866 A | 4/2020 |
| KR | 10-2020-0135637 A | 12/2020 |

OTHER PUBLICATIONS

Korean Intellectual Property Office, Office Action, Korean Patent Application No. 10-2021-0085398, Dec. 23, 2024, 19 pages.

*Primary Examiner* — Nelson Garces
(74) *Attorney, Agent, or Firm* — Fenwick & West LLP

(57) ABSTRACT

Embodiments of the present disclosure are related to a display device, as an active area overlapping a light detecting sensor positioned on a rear surface of a display panel has a low resolution and includes a plurality of holes that an insulating layer is etched, thus the display device that the light detecting sensor detects an object positioned in front of the display panel can be provided. Furthermore, as a light blocking pattern is disposed on an area overlapping an inclined surface inside of the hole, thus a distortion of a light entered to the inclined surface inside of the hole can be prevented and a detecting performance of the light detecting sensor positioned on the rear surface of the display panel can be improved.

16 Claims, 12 Drawing Sheets

(51) Int. Cl.
    *H10K 59/40*            (2023.01)
    *H10K 59/60*            (2023.01)
    *H10K 59/80*            (2023.01)
    *H10K 59/65*            (2023.01)

(56) References Cited

U.S. PATENT DOCUMENTS

| | | |
|---|---|---|
| 11,899,862 B2 | 2/2024 | Bok et al. |
| 2020/0357871 A1 | 11/2020 | Chung et al. |
| 2020/0373372 A1* | 11/2020 | Chung ............ H10K 59/124 |
| 2021/0057490 A1* | 2/2021 | Choi ............ H10K 59/8792 |
| 2021/0191552 A1* | 6/2021 | Bok ............ G06F 1/1681 |
| 2021/0249635 A1* | 8/2021 | Cho ............ H10K 50/86 |
| 2022/0077430 A1* | 3/2022 | Choi ............ H10K 59/8792 |
| 2022/0149135 A1* | 5/2022 | Choi ............ H10K 59/353 |
| 2024/0184390 A1 | 6/2024 | Bok et al. |

\* cited by examiner

DISPLAY DEVICE WITH MULTI-RESOLUTION

CROSS REFERENCE TO RELATED APPLICATION

This application claims priority from Korean Patent Application No. 10-2021-0085398, filed on Jun. 30, 2021, which is hereby incorporated by reference for all purposes as if fully set forth herein.

BACKGROUND

Field

Embodiments of the present disclosure are related to a display device.

Description of Related Art

The growth of the information society leads to increased demand for display devices to display images and use of various types of display devices, such as liquid crystal display devices, organic light emitting display devices, etc.

Display devices can include various types of sensors for providing various functions other than a function displaying an image. For example, the display devices can include an image sensor for photographing an object adjacent to the display devices, or an infrared sensor for detecting an object.

Even the display devices can provide more various functions to a user since the display devices include various types of sensors, but there is a problem that a bezel area of the display devices increases due to an arrangement of a sensor.

SUMMARY

Embodiments of the present disclosure can provide a display device that a sensor detecting an object positioned in front of a display panel is disposed on an area overlapping an area displaying an image.

Embodiments of the present disclosure can provide a display device capable of improving a detecting performance of a sensor which is disposed on an area overlapping an area displaying an image and detecting an object positioned in front of a display panel.

Embodiments of the present disclosure can provide a display device including a substrate on which a plurality of light-emitting elements are disposed and including a first active area having a first resolution and a second active area having a second resolution lower than the first resolution, and a light detecting sensor positioned on a rear surface of the substrate and overlapping the second active area.

At least one insulating layer can be disposed between the substrate and a layer where the plurality of light-emitting elements are disposed. The at least one insulating layer can include a plurality of holes positioned on the second active area.

An encapsulation layer can be disposed to seal the plurality of light-emitting elements.

A plurality of light blocking patterns can be positioned on the encapsulation layer. The plurality of light blocking patterns can be disposed on a part area of an area overlapping each of the plurality of holes included in the at least one insulating layer on the second active area.

At least one of the substrate and the at least one insulating layer can include an inclined portion positioned on an area overlapping the plurality of light blocking patterns.

Embodiments of the present disclosure can provide a display device including a substrate including a first active area having a first resolution and a second active area having a second resolution lower than the first resolution, a light detecting sensor positioned on a rear surface of the substrate and overlapping the second active area, an encapsulation layer disposed on the first active area and the second active area, a plurality of touch electrodes disposed on the encapsulation layer and disposed on the first active area and the second active area, and a plurality of light blocking patterns disposed on the encapsulation layer, disposed on the second active area, and disposed on a part area of an area other than area where the plurality of touch electrodes are disposed.

According to various embodiments of the present disclosure, by increasing a transmittance of a part area of an active area of a display panel, a display device with a sensor disposed on a rear surface of a display panel that can detect an object positioned in front of the display panel can be provided.

According to various embodiments of the present disclosure, as a light blocking pattern is disposed on an area where a transmittance difference exists or a distortion of a light can be generated among an area where a sensor is disposed, a display device with an improved detecting performance of the sensor disposed on a rear surface of a display panel can be provided.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
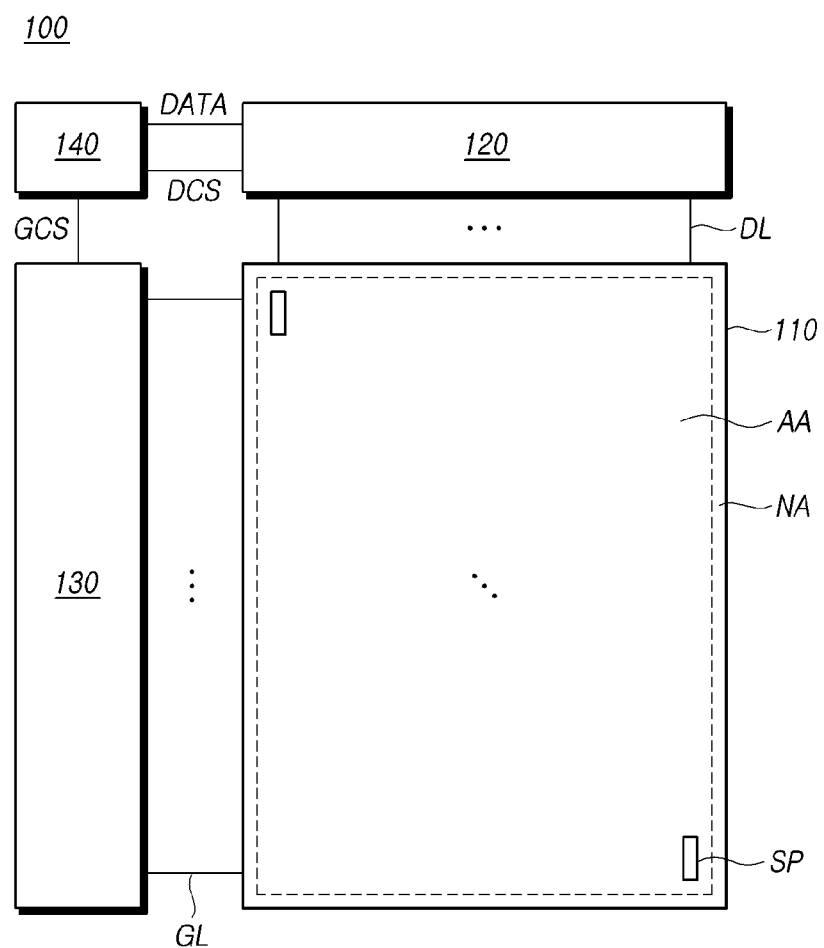
FIG. 1 is a diagram schematically illustrating a configuration included in a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a diagram schematically illustrating a configuration included in a display device 100 according to embodiments of the present disclosure. All the components of the display device 100 according to all embodiments of the present disclosure are operatively coupled and configured.

Referring to FIG. 1, the display device 100 can include a display panel 110, and a gate driving circuit 130, a data driving circuit 120 and a controller 140 for driving the display panel 110.

The display panel 110 can include an active area AA where a plurality of subpixels SP are disposed, and a non-active area which is located outside the active area AA.

A plurality of gate lines GL and a plurality of data lines DL can be arranged on the display panel 110. The plurality of subpixels SP can be located in areas where the gate lines GL and the data lines DL intersect each other.

The gate driving circuit 130 is controlled by the controller 140, and sequentially outputs scan signals to the plurality of gate lines GL arranged on the display panel 110, thereby controlling the driving timing of the plurality of subpixels SP.

The gate driving circuit 130 can include one or more gate driver integrated circuits GDIC, and can be located only at one side of the display panel 110, or can be located at both sides thereof depending on a driving method.

Each gate driver integrated circuit GDIC can be connected to a bonding pad of the display panel 110 by a tape automated bonding TAB method or a chip-on-glass COG method. Each gate driver integrated circuit GDIC can be implemented by a gate-in-panel GIP method to then be directly arranged on the display panel 110. In some cases, the gate driver integrated circuit GDIC can be integrated and arranged on the display panel 110. Alternatively, each gate driver integrated circuit GDIC can be implemented by a chip-on-film COF method in which an element is mounted on a film connected to the display panel 110.

The data driving circuit 120 receives image data from the controller 140 and converts the image data into an analog data voltage Vdata. Then, the data driving circuit 120 outputs the data voltage Vdata to each data line DL according to the timing at which the scan signal is applied through the gate line GL so that each of the plurality of subpixels SP emits light having brightness according to the image data.

The data driving circuit 120 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Each source driver integrated circuit SDIC can be directly disposed on the display panel 110. In some cases, the source driver integrated circuit SDIC can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 130 and the data driving circuit 120, and controls the operation of the gate driving circuit 130 and the data driving circuit 120.

The controller 140 can be mounted on a printed circuit board, a flexible printed circuit, or the like, and can be electrically connected to the gate driving circuit 130 and the data driving circuit 120 through the printed circuit board, the flexible printed circuit, or the like.

The controller 140 can allow the gate driving circuit 130 to output a scan signal according to the timing implemented in each frame. The controller 140 can convert a data signal received from the outside to conform to the data signal format used in the data driving circuit 120 and then output the converted image data to the data driving circuit 120.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 130 and the data driving circuit 120.

For example, in order to control the gate driving circuit 130, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 130. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 120, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 120. The source sampling clock SSC is a clock signal for controlling the timing of sampling data in the respective source driver integrated circuits SDIC. The source output enable signal SOE controls the output timing of the data driving circuit 120.

The display device 100 can further include a power management integrated circuit for supplying various voltages or currents to the display panel 110, the gate driving circuit 130, the data driving circuit 120, and the like or controlling various voltages or currents to be supplied thereto.

Each subpixel SP is an area defined by a cross of the gate line GL and the data line DL, and at least one circuit element including an element emitting light can be disposed in the subpixel SP.

For example, in a case that the display device 100 is an organic light-emitting display device, an organic light-emitting diode OLED and various circuit elements can be disposed on the plurality of subpixels SP. As current supplied to the organic light-emitting diode OLED disposed on the subpixel SP is controlled by the various circuit elements, each subpixel SP can represent a luminance corresponding to an image data.

Furthermore, the display device 100 according to embodiments of the present disclosure can provide a function detecting a touch of a user contacting the display panel 110.

Figure 2:
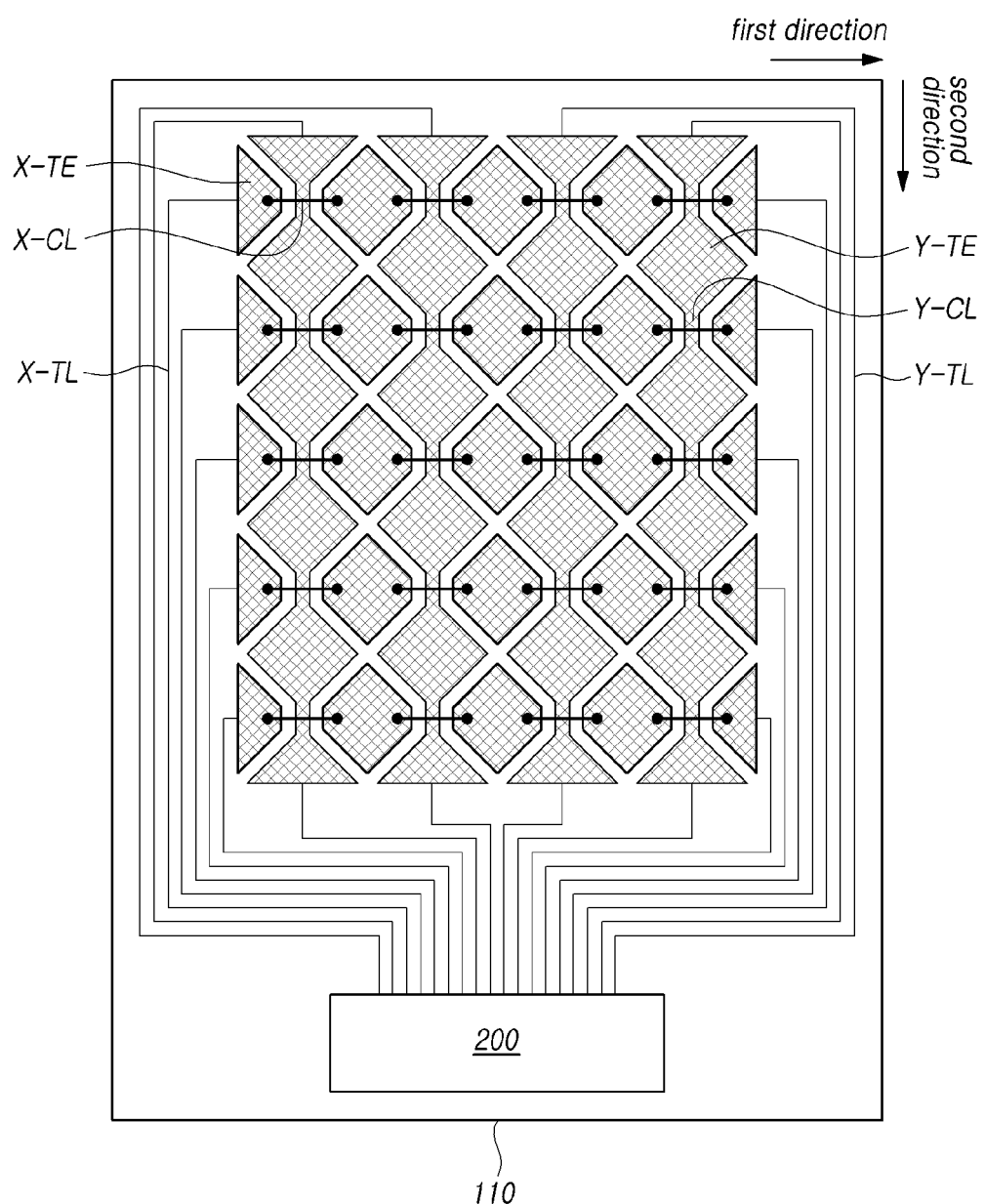
FIG. 2 is a diagram illustrating an example of a configuration for a touch sensor included in a display device according to embodiment of the present disclosure.

FIG. 2 is a diagram illustrating an example of a configuration for a touch sensing included in the display device 100 according to an embodiment of the present disclosure.

Referring to FIG. 2, the display device 100 can include a plurality of touch electrodes TE, a plurality of touch routing lines TL and a touch driving circuit 200.

The plurality of touch electrodes TE can be disposed on the active area AA of the display panel 110.

The touch electrode TE can be positioned on the display panel 110, or inside of the display panel 110 according to the display device 100.

In a case that the touch electrode TE is disposed inside of the display panel 110, the touch electrode TE can be an electrode used for a display driving, or an electrode disposed separately from an electrode for the display driving.

The touch electrode TE can be made of a transparent material. In this case, the touch electrode TE can be disposed as a bulk type (not including an opening portion).

Alternatively, the touch electrode TE can be made of an opaque material. In this case, the touch electrode TE can include a plurality of opening portions. The opening portion included in the touch electrode TE can overlap a light-emitting area of the subpixel SP disposed on the display panel 110.

The plurality of touch routing lines TL can be disposed on the non-active area NA of the display panel 110.

The touch routing line TL can be electrically connected to at least one touch electrode TE of the plurality of touch electrodes TE. The touch routing line TL connected to the touch electrode TE can be disposed on the non-active area NA or a boundary of the active area AA, and in some cases, can be partially disposed on the active area AA and connected to the touch electrode TE.

The touch routing line TL can supply a touch driving signal to the touch electrode TE. The touch routing line TL can transfer a touch sensing signal detected from the touch electrode TE to the touch driving circuit 200.

The touch driving circuit 200 can drive the touch electrode TE and sense a touch on the display panel 110 through the touch routing line TL.

The touch driving circuit 200 can be disposed separately from a circuit for the display driving. Alternatively, the touch driving circuit 200 can be implemented to be integral with at least one of circuits for the display driving. For example, the touch driving circuit 200 can be disposed to be implemented as one integrated circuit with the data driving circuit 120.

The touch driving circuit 200 can supply the touch driving signal to the touch electrode TE through the touch routing line TL. The touch driving circuit 200 can receive the touch sensing signal from the touch electrode TE through the touch routing line TL.

The touch driving circuit 200 can detect a change of capacitance generated by a touch of a user in a state that the touch driving signal is applied to the touch electrode TE. The touch driving circuit 200 can sense a touch on the display panel 110 based on the change of the capacitance.

The touch driving circuit 200, for example, can sense touch by detecting a change of self-capacitance.

In this case, each of the plurality of touch routing lines TL can be electrically connected to a respective one of the plurality of touch electrodes TE. The touch driving circuit 200 can drive the touch electrode TE respectively and perform a touch sensing.

The touch driving circuit 200, for another example, can sense a touch by detecting a change of mutual-capacitance.

In this case, two or more touch electrodes TE of the plurality of touch electrodes TE can be electrically connected along one direction. The touch routing line TL can be electrically connected to a row or a column of the touch electrode TE electrically connected along one direction.

For example, such as an example illustrated in FIG. 2, a plurality of X-touch electrodes X-TE can be electrically connected by an X-touch electrode connecting line X-CL along a first direction. The X-touch electrode connecting line X-CL can be disposed on a layer different from a layer where the X-touch electrode X-TE is disposed.

A plurality of Y-touch electrodes Y-TE can be electrically connected by a Y-touch electrode connecting line Y-CL along a second direction. The Y-touch electrode Y-TE can be disposed on a layer where the X-touch electrode X-TE is disposed. The Y-touch electrode connecting line Y-CL can be disposed on a layer where the Y-touch electrode Y-TE is disposed.

An X-touch routing line X-TL can be electrically connected to the X-touch electrode X-TE connected along the first direction. A Y-touch routing line Y-TL can be electrically connected to the Y-touch electrode Y-TE connected along the second direction.

One of the X-touch electrode X-TE and the Y-touch electrode Y-TE can be an electrode to which the touch driving signal is applied. Another one of the X-touch electrode X-TE and the Y-touch electrode Y-TE can be an electrode from which the touch sensing signal is detected.

The touch driving circuit 200 can detect the change of the mutual-capacitance generated by a touch of a user in a state that different signals are applied to the X-touch electrode X-TE and the Y-touch electrode Y-TE and sense a touch on the display panel 110.

Furthermore, the display device 100 according to embodiments of the present disclosure can include a sensor for detecting an object positioned in front of the display panel 110.

This sensor can be disposed on the non-active area NA of the display panel 110, but alternatively can be disposed on the active area AA for reducing the non-active area NA.

Figure 3:
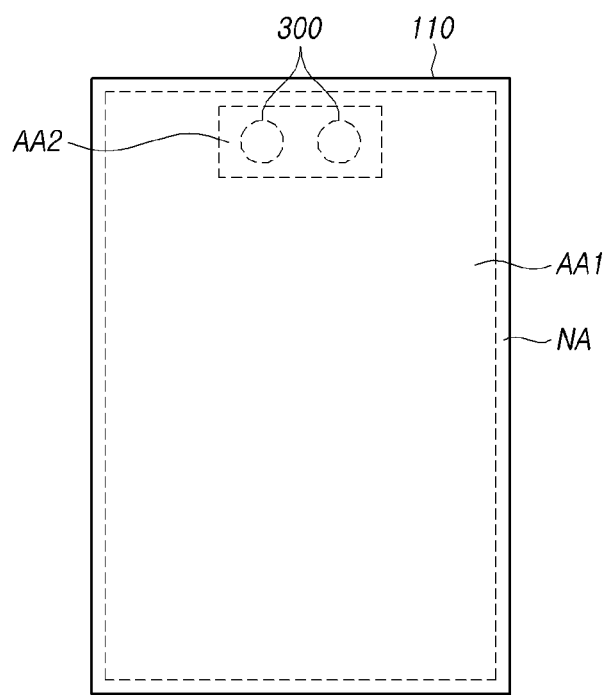
FIG. 3 is a diagram illustrating an example of a structure where a light detecting sensor is disposed in a display device according to embodiments of the present disclosure.

FIG. 3 is a diagram illustrating an example of a structure where a light detecting sensor 300 is disposed in the display device 100 according to embodiments of the present disclosure.

Referring to FIG. 3, the display device 100 can include at least one light detecting sensor 300 capable of detecting an object positioned in front of the display panel 110.

The light detecting sensor 300, for example, can be an infrared sensor or an image sensor. The light detecting sensor 300 can mean a camera module including the image sensor. The light detecting sensor 300 is not limited to above-mentioned examples, and can mean one of various sensors detecting a light entered from outside and performing a process based on the detected light.

The light detecting sensor 300 can be positioned on a rear surface of the display panel 110.

The light detecting sensor 300 can be positioned on an area overlapping at least a part of the active area AA of the display panel 110. As the light detecting sensor 300 is positioned on an area overlapping the active area AA, the non-active area NA may not increase even if the light detecting sensor 300 is disposed.

As the active area AA of the display panel 110 can have a transmittance of a certain level, the light detecting sensor 300 disposed on the display panel 110 can detect a light entered to a front surface of the display panel 110 and perform a function of a sensor.

Furthermore, by increasing a transmittance of an area where the light detecting sensor 300 is disposed more, a detecting performance of the light detecting sensor 300 can be enhanced.

For example, such as an example illustrated in FIG. 3, the active area AA of the display panel 110 can include a first active area AA1 having a first resolution and a second active area AA2 having a second resolution.

The second resolution can be lower than the first resolution.

For example, the number of the subpixels SP per a unit area disposed on the second active area AA2 can be smaller than the number of the subpixel SP per a unit area disposed on the first active area AA1. Alternatively, a space between the subpixels SP disposed on the second active area AA2 can be greater than a space between the subpixels SP disposed on the first active area AA1.

Furthermore, not limited to above-mentioned examples, the second active area AA2 can have various types of arrangement structures of the subpixels SP for having a lower resolution than the first active area AA1.

As the second active area AA2 has a lower resolution than the first active area AA1, a transmittance of the second active area AA2 can be greater than a transmittance of the first active area AA1.

The light detecting sensor 300 can be disposed on an area overlapping the second active area AA2 of the active area AA.

As the light detecting sensor 300 is disposed on an area overlapping the second active area AA2 where the transmittance is high, a detecting performance for light entered from outside can be improved.

As the first active area AA1 which is an area other than the second active area AA2 maintains a high resolution, a detecting performance of the light detecting sensor 300 positioned on a rear surface of the display panel 110 can be improved while maintaining an image quality of the display panel 110.

Furthermore, embodiments of the present disclosure, for increasing transmittance of the second active area AA2 more, can provide a structure that some components positioned inside of the display panel 110 are removed in at least a part area of the second active area AA2.

Figure 4:
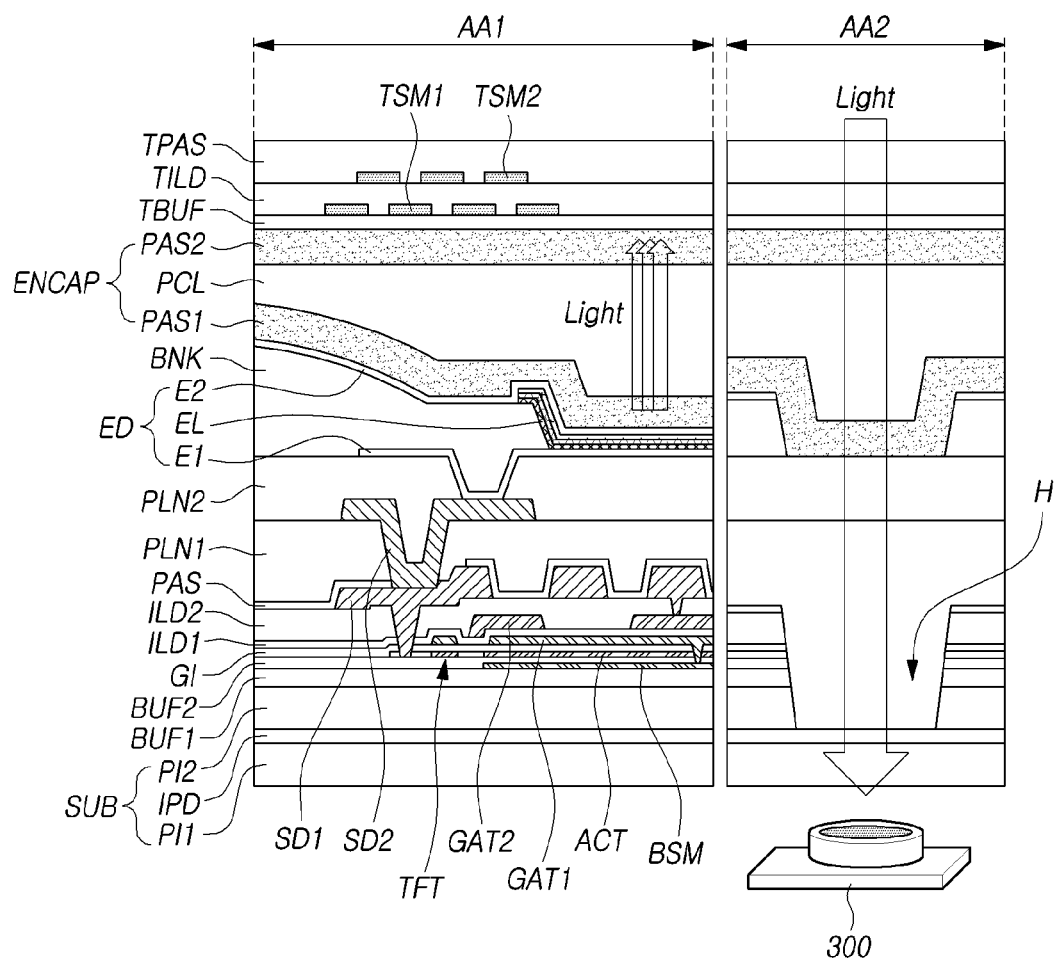
FIG. 4 is a diagram illustrating examples of a cross-sectional structure of a first active area and a cross-sectional structure of a second active area of a display panel in a display device according to embodiments of the present disclosure.

FIG. 4 is a diagram illustrating examples of a cross-sectional structure of the first active area AA1 and a cross-sectional structure of the second active area AA2 of the display panel 110 in the display device 100 according to embodiments of the present disclosure. Although FIG. 4 illustrates exemplarily a case that the display device 100 is an organic light-emitting display device, embodiments of the present disclosure can be applied to other types of display devices.

Referring to FIG. 4, the display panel 110 can include a plurality of metal layers and a plurality of insulating layers disposed on a substrate SUB.

For example, the substrate SUB can include a first polyimide layer PI1, a middle layer IPD and a second polyimide layer PI2.

A plurality of buffer layers BUF1, BUF2 can be disposed on the substrate SUB.

Various metal layers such as a back shield metal layer BSM, a gate metal layers GAT1, GAT2 and source drain metal layers SD1, SD2 can be disposed on the buffer layers BUF1, BUF2.

A semiconductor layer such as an active layer ACT can be disposed on the buffer layers BUF1, BUF2.

A thin film transistor TFT can be disposed by using the metal layer and the semiconductor layer.

Various insulating layers such as a gate insulating layer GI, an interlayer insulating layers ILD1, ILD2, a passivation layer PAS and a planarization layers PLN1, PLN2 can be on the buffer layers BUF1, BUF2.

A light-emitting element ED including a first electrode E1, a light-emitting layer EL and a second electrode E2 can be disposed on the planarization layers PLN1, PLN2. The light-emitting layer EL can emit one of a red light, a green light and a blue light, or emit a white light.

An area where the first electrode E1 and the light-emitting layer EL overlap can be defined as a light-emitting area, and a bank BNK can be disposed on an area other than the light-emitting area. A part of the second electrode E2 can be disposed on the bank BNK.

An encapsulation layer ENCAP can be disposed on the second electrode E2.

The encapsulation layer ENCAP, for example, can include a first encapsulation layer PAS1, a second encapsulation layer PCL and a third encapsulation layer PAS2. The first encapsulation layer PAS1 and the third encapsulation layer PASS can be inorganic encapsulation layers. The second encapsulation layer PCL can be an organic encapsulation layer.

In a case that the display device 100 provides touch sensing function, the metal layer and the insulating layer for touch sensing can be disposed on the encapsulation layer ENCAP.

For example, a touch buffer layer TBUF can be disposed on the encapsulation layer ENCAP. A first touch sensor metal TSM1 can be disposed on the touch buffer layer TBUF. In some cases, the touch buffer layer TBUF may not be disposed, and the first touch sensor metal TSM1 can be disposed on the encapsulation layer ENCAP directly.

A touch insulating layer TILD can be disposed on the first touch sensor metal TSM1.

A second touch sensor metal TSM2 can be disposed on the touch insulating layer TILD. A touch passivation layer TPAS can be disposed on the second touch sensor metal TSM2.

The first touch sensor metal TSM1 and the second touch sensor metal TSM2 can constitute a touch sensor by being electrically connected to each other through a contact hole formed in the touch insulating layer TILD.

For example, in a touch sensor structure of the mutual-capacitance sensing method above-mentioned, the second touch sensor metal TSM2 can constitute the touch electrode TE, and the first touch sensor metal TSM1 can constitute the touch electrode connecting line CL.

The touch sensor metal TSM can be disposed to avoid the light-emitting area of the subpixel SP, and can be positioned above the bank BNK.

The metal layer and the insulating layer can be disposed on the first active area AA1 of the display panel 110 such as a structure described above.

The metal layer and the insulating layer can be disposed on the subpixel SP of the second active area AA2 of the display panel 110 such as a structure described above. At least a part of the metal layer and the insulating layer can be removed on at least a part area of an area other than the subpixel SP of the second active area AA2 for improving the transmittance.

Referring to an example of a cross-sectional structure of the second active area AA2 illustrated in FIG. 4, the second active area AA2 can overlap the light detecting sensor 300 positioned on a rear surface of the substrate SUB.

The metal layer may not be disposed on an area other than the subpixel SP on the second active area AA2.

At least a part of the insulating layer can be an etched shape on an area other than the subpixel SP on the second active area AA2.

For example, the buffer layers BUF1, BUF2, the gate insulating layer GI and the interlayer insulating layers ILD1, ILD2 positioned on the substrate SUB can be etched. An area where the buffer layers BUF1, BUF2, the gate insulating layer GI and the interlayer insulating layers ILD1, ILD2 are etched can form a hole H.

In some cases, a part of an upper portion of the substrate SUB can be etched. For example, a part of the second polyimide layer PI2 included in the substrate SUB is etched to form the hole H.

Also, the bank BNK may not be positioned on an area corresponding to the hole H. Furthermore, the second electrode E2 of the light-emitting element ED may not be positioned on the hole H.

Furthermore, an example illustrated in FIG. 4 represents a structure where the planarization layers PLN1, PLN2 are disposed in the hole H, but in some cases, the planarization layers PLN1, PLN2 can be also an etched structure in the hole H. In this case, the encapsulation layer ENCAP can be disposed inside of the hole H.

A plurality of holes H can be positioned on an area other than an area where the subpixel SP is disposed on the second active area AA2.

Such as an example described above, as the hole H is formed by etching at least a part of the insulating layer disposed on the second active area AA2, the transmittance of the second active area AA2 can be increased.

As the transmittance of the second active area AA2 is increased, the amount of light entered to the light detecting sensor 300 positioned on the rear surface of the substrate SUB increases, and a detecting performance by the light detecting sensor 300 can be improved.

Furthermore, embodiments of the present disclosure can provide methods capable of preventing distortion of an image or a data detected by the light detecting sensor 300 that is generated due to a transmittance difference or a refraction of a light on an inclined surface of the hole H formed on the second active area AA2.

Figure 5:
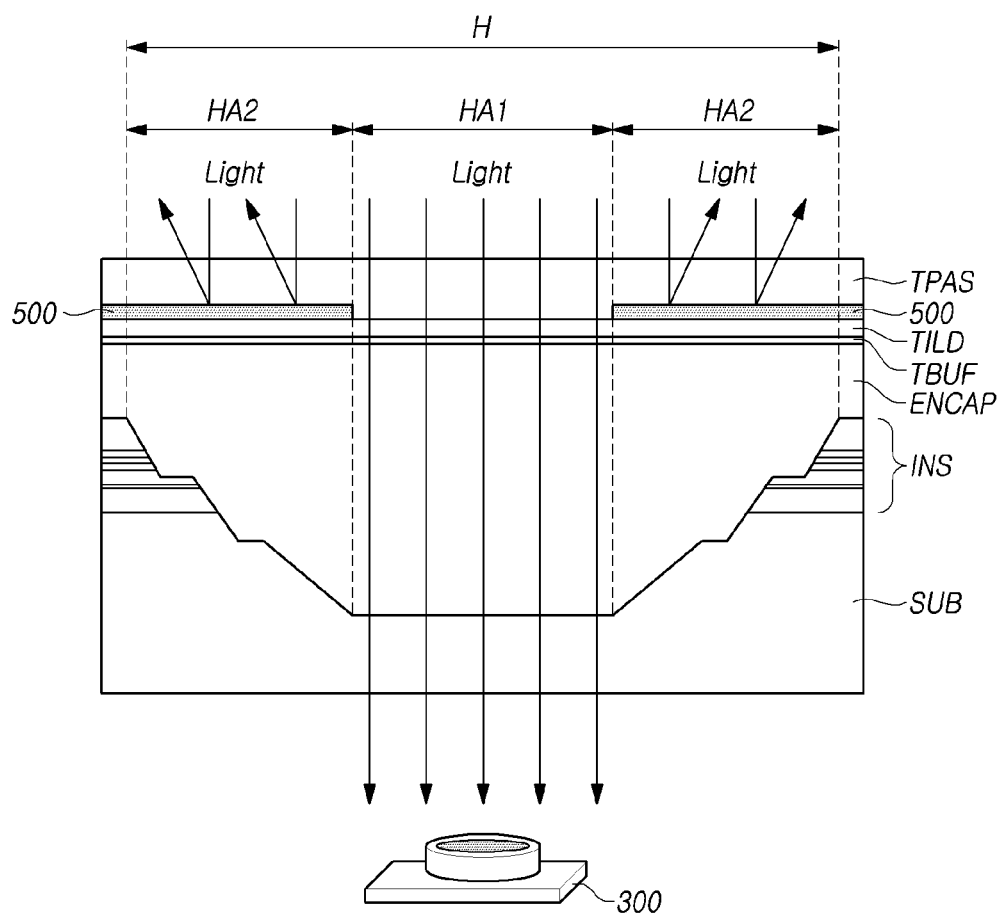
FIG. 5 is a diagram illustrating another example of a cross-sectional structure of a second active area of a display panel in a display device according to embodiments of the present disclosure.

FIG. 5 is a diagram illustrating another example of a cross-sectional structure of the second active area AA2 of the display panel 110 in the display device 100 according to embodiments of the present disclosure.

Referring to FIG. 5, it illustrates an example of a cross-sectional structure of an area where the hole H is disposed on the second active area AA2.

At least a part of an upper portion of the substrate SUB can be etched on the second active area AA2. At least a part of a plurality of insulating layers INS disposed on the second active area AA2 can be etched.

An area where the substrate SUB and the insulating layer INS are etched can form the hole H.

The encapsulation layer ENCAP can be disposed inside of the hole H.

The touch buffer layer TBUF, the touch insulating layer TILD and the touch passivation layer TPAS can be disposed on the encapsulation layer ENCAP, but in a case that the touch sensing function is not implemented, above-mentioned layers may not be disposed on the encapsulation layer ENCAP.

A light blocking pattern 500 can be disposed on a part area of an area overlapping the hole H on the encapsulation layer ENCAP.

The light blocking pattern 500, for example, can be a pattern made of a material of which a reflectivity to light is very high, such as metal. Alternatively, the light blocking pattern 500 can be a pattern made of a material of which a transmittance to light is very low even if transmitting some of the light.

The light blocking pattern 500 can be disposed on at least one layer of layers positioned on the encapsulation layer ENCAP. The light blocking pattern 500 can be disposed on a flat surface on the encapsulation layer ENCAP.

The light blocking pattern 500 can overlap a part of the hole H.

The hole H, for example, can include a first hole area HA1 being a central area of the hole H and positioned on a flat top surface of the substrate SUB and a second hole area HA2 being an outer area of the hole H and surrounding the first hole area HA1.

At least some of the substrate SUB and the insulating layer INS positioned on the second hole area HA2 can include an inclined portion. A thickness of at least some of the substrate SUB and the insulating layer INS positioned on the second hole area HA2 may not be constant.

The light blocking pattern 500 can be disposed on an area overlapping the second hole area HA2 of the hole H. Alternatively, the light blocking pattern 500 can be disposed on an area including at least a part area of an area overlapping the second hole area HA2 of the hole H.

The light blocking pattern 500, for example, can be disposed inside an area of the hole H adjacent to a boundary of the hole H. A part or a boundary of the light blocking pattern 500 can overlap the boundary of the hole H.

The light blocking pattern 500 can be disposed on the second hole area HA2, and can be disposed on an area including an area overlapping an end portion of the inclined portion of the substrate SUB and the insulating layer INS.

As the light blocking pattern 500 is disposed on the second hole area HA2, a light entering the second hole area HA2 can be blocked by the light blocking pattern 500.

A light entering through the first hole area HA1 only can be transferred to the light detecting sensor 300.

As light entering the second hole area HA2 is blocked, a distortion due to refraction of light can be prevented on the inclined portion of the substrate SUB and the insulating layer INS. Furthermore, distortion due to a transmittance difference can be prevented on a portion where a thickness of the substrate SUB and the insulating layer INS is not constant.

Transmittance of the second active area AA2 can be improved by forming the hole H on the second active area AA2. As the light blocking pattern 500 is disposed on only some area overlapping the inclined surface inside of the hole H, distortion of light can be prevented while minimizing reduction of transmittance, and detecting performance of the light detecting sensor 300 can be improved.

The light blocking pattern 500 can be disposed by adding a layer where a separate material is disposed on the encapsulation layer ENCAP.

Alternatively, the light blocking pattern 500 can be disposed by using the metal layer disposed for implementing a touch sensor on the encapsulation layer ENCAP.

For example, the light blocking pattern 500 can be implemented by using at least one of the first touch sensor metal TSM1 and the second touch sensor metal TSM2.

In this case, a structure where the touch sensor metal TSM is disposed can be different from each other on the first active area AA1 and the second active area AA2.

Figure 6:
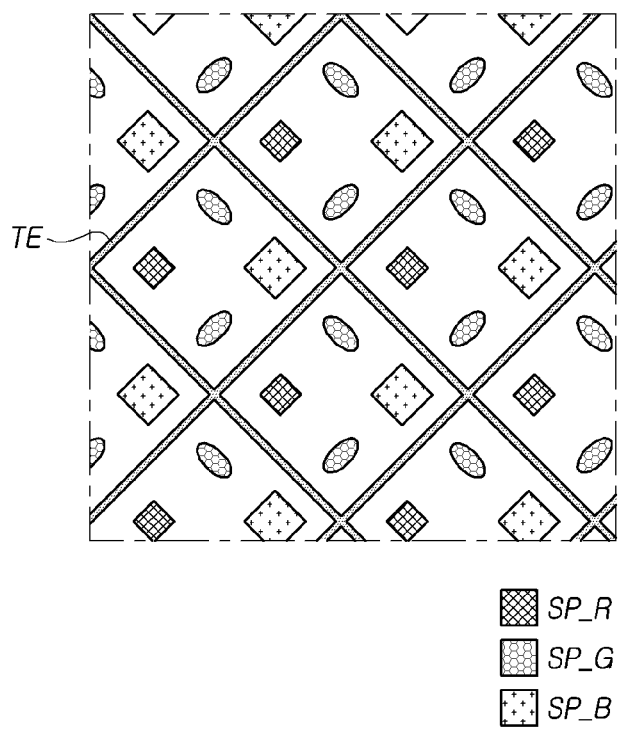
FIG. 6 is a diagram illustrating an example of a planar structure of a first active area of a display panel in a display device according to embodiments of the present disclosure.
Figure 7:
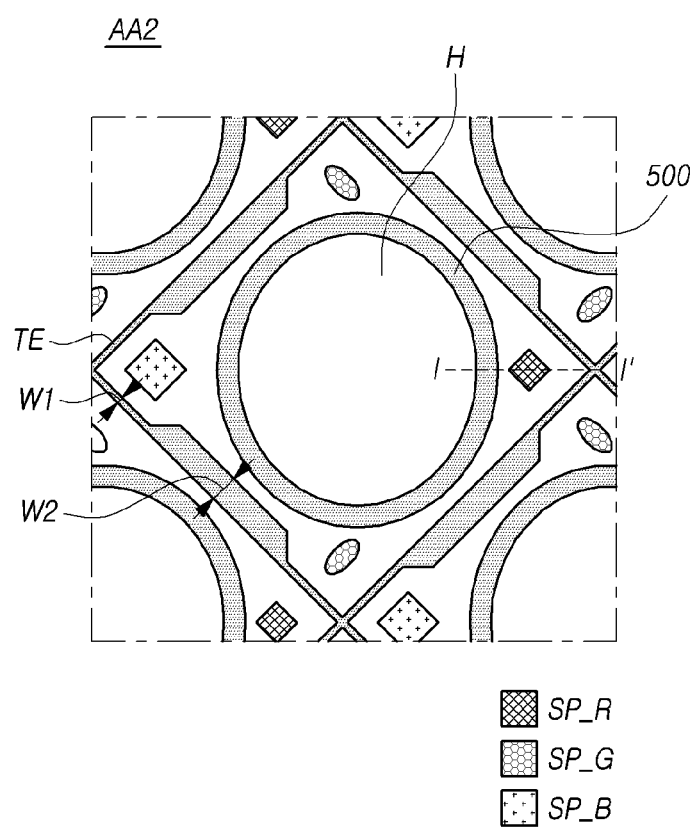
FIG. 7 is a diagram illustrating an example of a planar structure of a second active area of a display panel in a display device according to embodiments of the present disclosure.
Figure 8:
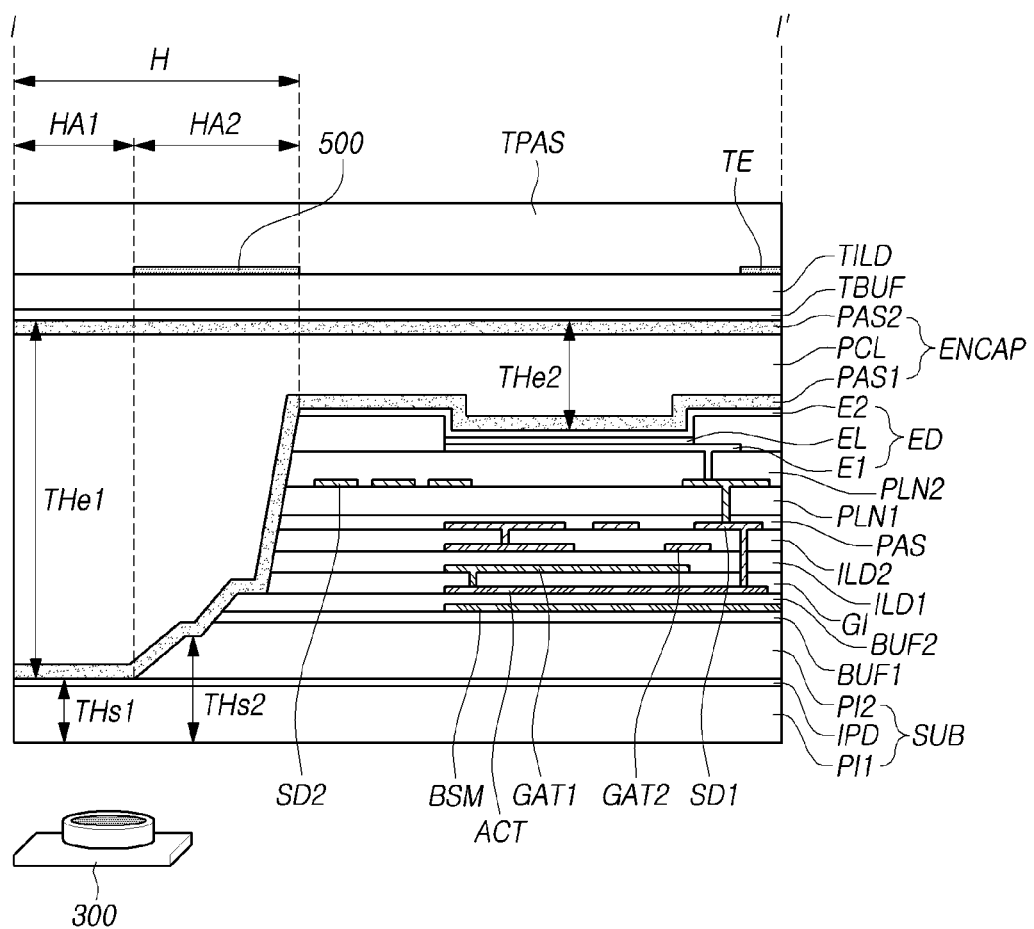
FIGS. 8 to 10 are diagrams illustrating examples of a cross-sectional structure of I-I' portion illustrated in FIG. 7.
Figure 9:
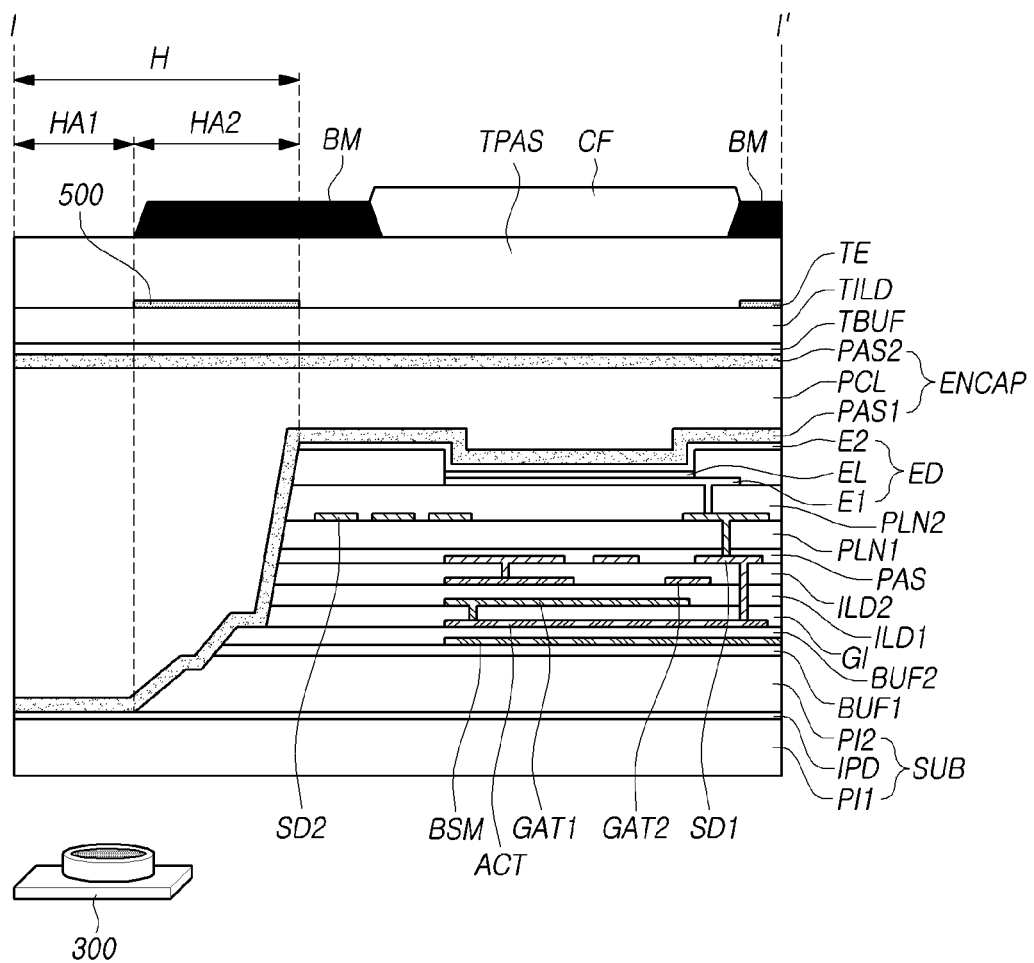
Figure 10:
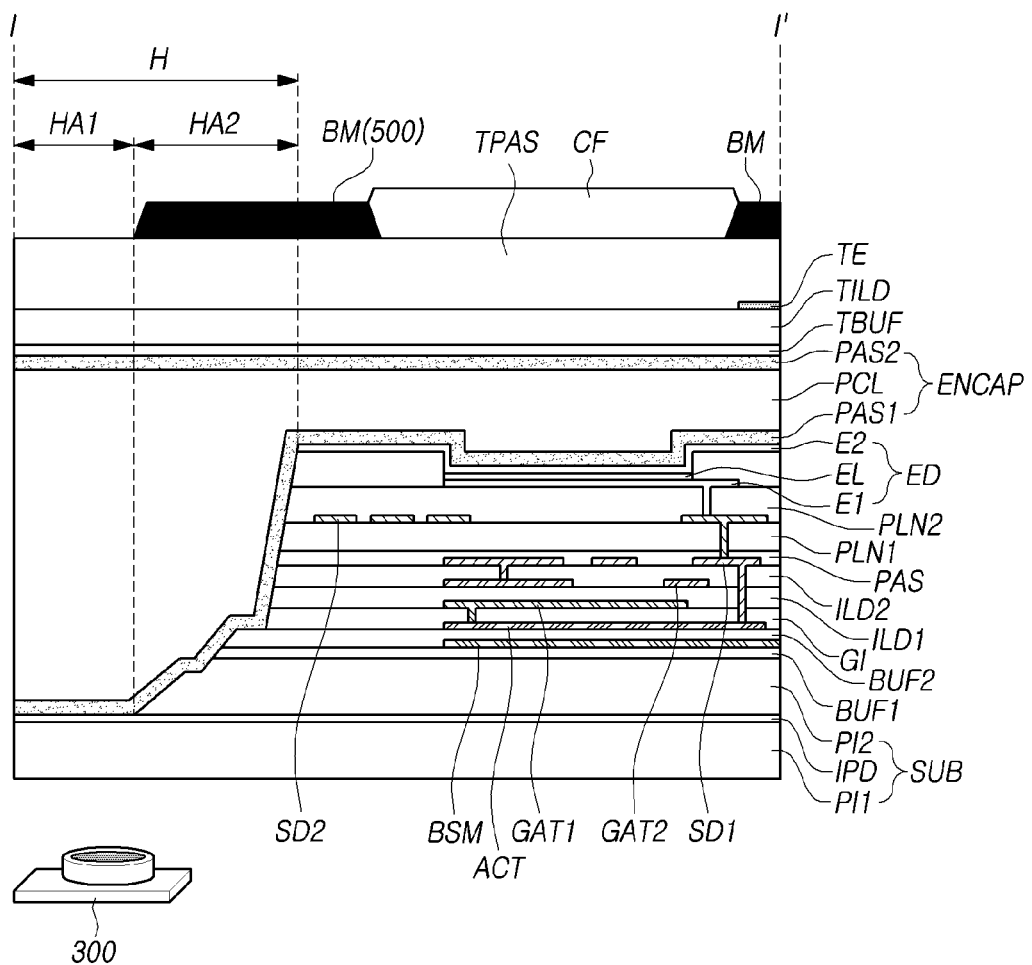

FIG. 6 is a diagram illustrating an example of a plane structure of the first active area AA1 of the display panel 110 in the display device 100 according to embodiments of the present disclosure. FIG. 7 is a diagram illustrating an example of a plane structure of the second active area AA2 of the display panel 110 in the display device 100 according to embodiments of the present disclosure. FIGS. 8 to 10 are diagrams illustrating examples of a cross-sectional structure of I-I' portion illustrated in FIG. 7.

Referring to FIGS. 6 and 7, the first active area AA1 can have the first resolution, and the second active area AA2 can have the second resolution lower than the first resolution.

For example, one red subpixel SP_R, two green subpixels SP_G and one blue subpixel SP_B can be disposed to form one group. A space between the group of subpixels SP disposed on the second active area AA2 can be greater than a space between the group of subpixels SP disposed on the first active area AA1.

The touch electrode TE can be disposed to avoid the subpixel SP or the light-emitting area of the subpixel SP on the first active area AA1. The touch electrode TE can be disposed on the first active area AA1 as a constant width.

The touch electrode TE can be disposed to avoid the subpixel SP or the light-emitting area of the subpixel SP on the second active area AA2. The touch electrode TE can be disposed to avoid the hole H formed for improvement of transmittance of the second active area AA2.

An area of the touch electrode TE disposed on the second active area AA2 can be relatively smaller than an area of the touch electrode TE disposed on the first active area AA1.

By increasing a width of at least a part of the touch electrode TE disposed on the second active area AA2, sensitivity difference due to an area difference of the touch electrode TE on the first active area AA1 and the second active area AA2 can be reduced.

For example, such as an example illustrated in FIG. 7, the touch electrode TE disposed on the second active area AA2 can include a portion having a first width W1 and a portion having a second width W2 greater than the first width W1.

As an overall area of the touch electrode TE can increase by the portion having the second width W2 in the touch electrode TE, touch sensitivity can be maintained similarly on the first active area AA1 and the second active area AA2.

The plurality of holes H can be positioned on at least a part area of an area where the touch electrode TE is not disposed on the second active area AA2.

The light blocking pattern 500 can be disposed on a part area of an area where the touch electrode TE is not disposed on the second active area AA2. The light blocking pattern 500 can be disposed on a part area of an area overlapping the hole H.

The light blocking pattern 500, such as an example illustrated in FIG. 7, can be disposed as a ring shape along the outer area of the hole H, but is not limited to this.

The light blocking pattern 500 can be disposed to be separated from the touch electrode TE. The light blocking pattern 500 can be a floated pattern that an electrical signal is not supplied.

As the light blocking pattern 500 is disposed by using a same material as the touch electrode TE, the light blocking pattern 500 can be disposed easily without adding a separate layer.

The light blocking pattern 500 can be disposed to overlap a part area of the hole H, and can prevent a performance drop of the light detecting sensor 300 due to a distortion of a light on the outer area of the hole H.

Referring to FIG. 7, the light blocking pattern 500 can be disposed to overlap the second hole area HA2 on the hole H.

At least some of the substrate SUB and various insulating layers INS positioned on the second hole area HA2 can include the inclined portion. A thickness of at least some of the substrate SUB and various insulating layers INS positioned on the second hole area HA2 may not be constant.

As the light blocking pattern 500 blocks or reduces light entered through the second hole area HA2, distortion of a light generated on the inclined surface of the substrate SUB and the insulating layer INS can be prevented.

A part of an upper portion of the substrate SUB can be removed in the hole H.

A thickness THs1 of the substrate SUB positioned on the first hole area HA1 of the hole H can be smaller than a thickness THs2 of the substrate SUB positioned on the second hole area HA2.

All insulating layers INS positioned between the substrate SUB and a layer where the light-emitting element ED is disposed can be etched on the hole H.

The encapsulation layer ENCAP can be disposed to fill inside of the hole H. A top surface of the encapsulation layer ENCAP can be disposed to be flat, and the touch electrode TE and the light blocking pattern 500 can be disposed on the encapsulation layer ENCAP.

A thickness THe1 of the encapsulation layer ENCAP disposed on the hole H can be greater than a thickness THe2 of the encapsulation layer ENCAP disposed on the light-emitting element ED.

As the light blocking pattern 500 is disposed on an area overlapping the hole H, a thickness of the thickest portion of the encapsulation layer ENCAP positioned under the light blocking pattern 500 can be also greater than a thickness of the thickest portion of the encapsulation layer ENCAP positioned under the touch electrode TE.

As disposing the light blocking pattern 500 on a part area of the hole H, a distortion of light entered through the hole H where a transmittance is high can be prevented, and a detecting performance of the light detecting sensor 300 can be improved.

Furthermore, depending on the display device 100, a configuration for blocking a light can be disposed over or under the light blocking pattern 500 additionally.

Referring to FIG. 9, in a case where the light-emitting element ED disposed on the subpixel SP emits white light, a layer where a color filter CF is positioned can be present on the encapsulation layer ENCAP.

The layer where the color filter CF is positioned can be an upper layer or a lower layer of a layer where the touch electrode TE is disposed.

The color filter CF can be disposed on an area corresponding to the light-emitting area of the subpixel SP. A black matrix BM can be disposed on an area where the color filter CF is not disposed on a layer where the color filter CF is disposed.

The black matrix BM can be disposed on an area other than the light-emitting area of the subpixel SP.

A part of the black matrix BM can overlap the light blocking pattern 500.

As the black matrix BM is positioned on the light blocking pattern 500, an effect for blocking a light entering the inclined surface inside of the hole H can be increased.

Alternatively, in a case that the black matrix BM is disposed on the encapsulation layer ENCAP, the light blocking pattern 500 may not be disposed on a layer where the touch electrode TE is disposed.

Referring to FIG. 10, the color filter CF and the black matrix BM can be disposed on the encapsulation layer ENCAP.

The black matrix BM can be disposed to avoid the light-emitting area of the subpixel SP. The black matrix BM can be disposed on an area including an area overlapping the inclined surface inside of the hole H.

As the black matrix BM overlaps the inclined surface inside of the hole H and blocks a light entering the second hole area HA2, the black matrix BM can prevent distortion of light entering the inclined surface inside of the hole H.

In a structure that the touch electrode TE is not disposed on the encapsulation layer ENCAP, a structure preventing distortion of light in the hole H can be implemented by using the black matrix BM without adding a separate layer. In this case, the black matrix BM can be seen as the light blocking pattern 500.

Furthermore, embodiments of the present disclosure, in a case of implementing the light blocking pattern 500 by using the touch sensor metal TSM, can use the light blocking pattern 500 as a part of the touch electrode TE.

Figure 11:
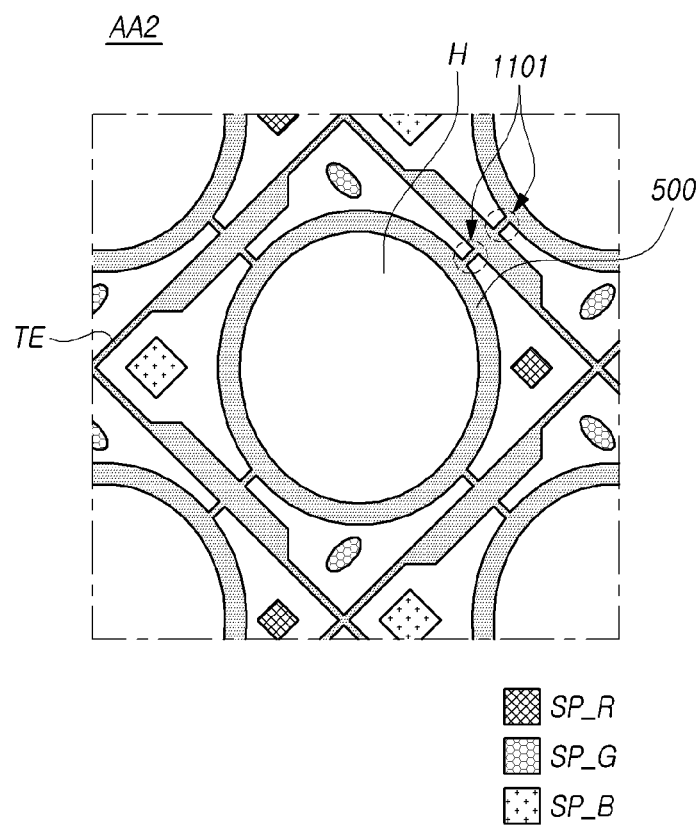
FIGS. 11 to 12 are diagrams illustrating other examples of a planar structure of a second active area of a display panel in a display device according to embodiments of the present disclosure.
Figure 12:
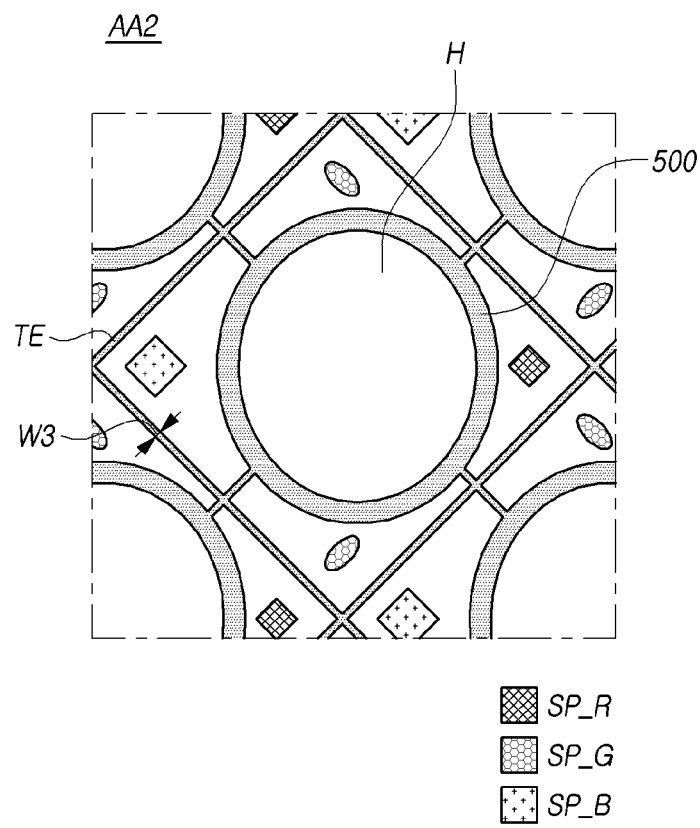

FIGS. 11 to 12 are diagrams illustrating other examples of a plane structure of the second active area AA2 of the display panel 110 in the display device 100 according to embodiments of the present disclosure.

Referring to FIG. 11, the touch electrode TE can be disposed on a part area of an area other than the subpixel SP or the light-emitting area of the subpixel SP on the second active area AA2.

The hole H can be positioned on an area other than the subpixel SP or the light-emitting area of the subpixel SP inside of the touch electrode TE. The light blocking pattern 500 can be disposed on a part area of an area overlapping the hole H. The light blocking pattern 500 can be disposed along the outer area of the hole H.

The light blocking pattern 500 can be made of a same material as the touch electrode TE, and can be disposed on a layer where the touch electrode TE is disposed.

The light blocking pattern 500 can be electrically connected to the touch electrode TE.

For example, by a portion indicated by 1101 illustrated in FIG. 11, the light blocking pattern 500 can be connected to the touch electrode TE. The light blocking pattern 500 and the touch electrode TE can be connected to each other in various shapes on an area avoiding the light-emitting area of the subpixel SP.

As the light blocking pattern 500 is disposed along the outer area of the hole H, it can prevent distortion of light entering the inclined surface inside of the outer area of the hole H.

As the light blocking pattern 500 is connected to the touch electrode TE, it can perform a function of the touch electrode TE.

An overall area of the touch electrode TE can increase by the light blocking pattern 500. Sensitivity of the touch electrode TE disposed on the second active area AA2 can be improved.

A difference between an overall area of the touch electrode TE disposed on the second active area AA2 and an overall area of the touch electrode TE disposed on the first active area AA1 can be reduced.

Although a structure of the touch electrode TE disposed on the first active area AA1 is different from a structure of the touch electrode TE disposed on the second active area AA2, sensitivity difference of the touch electrode TE can be reduced.

Furthermore, as an overall area of the touch electrode TE disposed on the second active area AA2 increases by the light blocking pattern 500, a width of the touch electrode TE can be constant.

Referring to FIG. 12, the touch electrode TE can be disposed on the second active area AA2. The hole H can be positioned inside of the touch electrode TE, and the light blocking pattern 500 can be disposed along the outer area of the hole H.

The light blocking pattern 500 and the touch electrode TE can be connected to each other.

A width of the touch electrode TE disposed on the second active area AA2 can be constant.

A third width W3 of the touch electrode TE disposed on the second active area AA2 can be identical to the first width W1 of the touch electrode TE disposed on the first active area AA1.

A width of the touch electrode TE can be constant on the first active area AA1 and the second active area AA2, and an area difference of the touch electrode TE can be compensated by the light blocking pattern 500.

The embodiments of the present disclosure described above will be briefly described as follows.

A display device 100 according to embodiments of the present disclosure can include a substrate SUB on which a plurality of light-emitting elements ED are disposed and including a first active area AA1 having a first resolution and a second active area AA2 having a second resolution lower than the first resolution, a light detecting sensor 300 positioned on a rear surface of the substrate SUB and overlapping the second active area AA2, at least one insulating layer INS disposed between the substrate SUB and a layer where the plurality of light-emitting elements ED are disposed and including a plurality of holes H positioned on the second active area AA2, an encapsulation layer ENCAP sealing the plurality of light-emitting elements ED, and a plurality of light blocking patterns 500 positioned on the encapsulation layer ENCAP and disposed on a part area of an area overlapping each of the plurality of holes H included in the at least one insulating layer INS on the second active area AA2.

At least one of the substrate SUB and the at least one insulating layer INS can include an inclined portion positioned on an area overlapping the plurality of light blocking patterns 500.

Each of the plurality of light blocking patterns 500 can be disposed on an inside area of each of the plurality of holes H adjacent to a boundary of each of the plurality of holes H among an area overlapping the each of the plurality of holes H.

A part or a boundary of each of the plurality of light blocking patterns 500 can overlap a boundary of each of the plurality of holes H.

A plurality of touch electrodes TE can be disposed on the encapsulation layer ENCAP, and the plurality of light blocking patterns 500 can be disposed on a layer same as a layer where the plurality of touch electrodes TE are disposed.

The plurality of light blocking patterns 500 can be disposed to be separated from the plurality of touch electrodes TE.

Alternatively, the plurality of light blocking patterns 500 can be disposed to be connected to one of the plurality of touch electrodes TE.

At least one of a shape and a width of the touch electrode TE disposed on the second active area AA2 among the plurality of touch electrodes TE can be different from at least one of a shape and a width of the touch electrode TE disposed on the first active area AA1.

At least one of the plurality of light blocking patterns 500 can be positioned inside of the plurality of touch electrodes TE.

A thickness of the encapsulation layer ENCAP positioned under the plurality of light blocking patterns 500 can be greater than a thickness of the encapsulation layer ENCAP positioned under the plurality of touch electrodes TE.

A plurality of color filters CF can be disposed on an upper layer or a lower layer of a layer where the plurality of touch electrodes TE are disposed on the encapsulation layer ENCAP. A black matrix BM can be disposed on a layer where the plurality of color filters CF are disposed and can overlap the plurality of light blocking patterns 500.

Alternatively, a plurality of color filters CF can be positioned on the encapsulation layer ENCAP, and the plurality of light blocking patterns 500 can be disposed on a layer same as a layer where the plurality of color filters CF are disposed The plurality of holes H can be positioned on an area other than an area on which the plurality of light-emitting elements ED are disposed on the second active area AA2.

A thickness of the thickest portion of the encapsulation layer ENCAP positioned in the plurality of holes H can be greater than a thickness of the thickest portion of the encapsulation layer ENCAP positioned on the plurality of light-emitting elements ED.

The encapsulation layer ENCAP can contact the substrate SUB in the plurality of holes H.

A part of an upper portion of the substrate SUB can be removed in the plurality of holes H.

A thickness of the substrate SUB positioned on an area overlapping the plurality of light blocking patterns 500 in the plurality of holes H can be greater than a thickness of the substrate SUB positioned on an area other than an area overlapping the plurality of light blocking patterns 500 in the plurality of holes H.

A display device 100 according to embodiments of the present disclosure can include a substrate SUB including a first active area AA1 having a first resolution and a second active area AA2 having a second resolution lower than the first resolution, a light detecting sensor 300 positioned on a rear surface of the substrate SUB and overlapping the second active area AA2, an encapsulation layer ENCAP disposed on the first active area AA1 and the second active area AA2, a plurality of touch electrodes TE disposed on the encapsulation layer ENCAP and disposed on the first active area AA1 and the second active area AA2, and a plurality of light blocking patterns 500 disposed on the encapsulation layer ENCAP, disposed on the second active area AA2, and disposed on a part area of an area other than area where the plurality of touch electrodes TE are disposed.

According to embodiments of the present disclosure described above, as the light detecting sensor 300 is disposed on an area overlapping the second active area AA2 where a resolution is low among the active area AA and the plurality of holes H are positioned, the light detecting sensor 300 positioned on the rear surface of the display panel 110 can sense an object positioned in front of the display panel 110.

Furthermore, as the light blocking pattern 500 is disposed on an area overlapping the inclined surface positioned inside of the hole H, a distortion of a light entered to the inclined surface inside of the hole H can be prevented and a detecting performance of the light detecting sensor 300 can be improved.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
   a substrate on which a plurality of light-emitting elements are disposed, and including a first active area having a first resolution and a second active area having a second resolution lower than the first resolution;
   a light detecting sensor positioned on a rear surface of the substrate, and overlapping the second active area;
   at least one insulating layer disposed between the substrate and a layer where the plurality of light-emitting elements are disposed, and including a plurality of holes positioned on the second active area;
   an encapsulation layer sealing the plurality of light-emitting elements;
   a touch insulating layer positioned on the encapsulation layer;
   a touch passivation layer positioned on the touch insulating layer;
   a plurality of touch electrodes disposed between the touch insulating layer and the touch passivation layer; and
   a plurality of light blocking patterns disposed on a layer same as a layer where the plurality of touch electrodes are disposed and formed from the same material as the plurality of touch electrodes,
   wherein each of the plurality of holes on the second active area includes a first hole region with a flat portion, and a second hole region surrounding the first hole region, with the second hole region including an inclined portion of the at least one insulating layer,
   wherein the plurality of light blocking patterns do not overlap the plurality of touch electrodes, and the plurality of light blocking patterns overlap at least a portion of the second hole region.

2. The display device of claim 1, wherein each of the plurality of light blocking patterns is disposed on an inside area of each of the plurality of holes adjacent to a boundary of the each of the plurality of holes among an area overlapping the each of the plurality of holes.

3. The display device of claim 1, wherein a part or a boundary of each of the plurality of light blocking patterns overlaps a boundary of each of the plurality of holes.

4. The display device of claim 1, wherein the plurality of light blocking patterns are separated from the plurality of touch electrodes.

5. The display device of claim 1, wherein each of the plurality of light blocking patterns is connected to a respective one of the plurality of touch electrodes.

6. The display device of claim 1, wherein at least one of a shape and a width of the touch electrode disposed on the second active area among the plurality of touch electrodes is different from the touch electrode disposed on the first active area.

7. The display device of claim 1, wherein at least one of the plurality of light blocking patterns is positioned inside of the plurality of touch electrodes.

8. The display device of claim 1, wherein a thickness of the encapsulation layer positioned under the plurality of light blocking patterns is greater than a thickness of the encapsulation layer positioned under the plurality of touch electrodes.

9. The display device of claim 1, further comprising:
   a plurality of color filters disposed on an upper layer or a lower layer of a layer where the plurality of touch electrodes are disposed on the encapsulation layer; and
   a black matrix disposed on a layer where the plurality of color filters are disposed, and overlapping the plurality of light blocking patterns.

10. The display device of claim 1, further comprising:
    a plurality of color filters positioned on the encapsulation layer, and
    wherein the plurality of light blocking patterns are disposed on a layer same as a layer where the plurality of color filters are disposed.

11. The display device of claim 1, wherein the plurality of holes are positioned on an area other than an area on which the plurality of light-emitting elements are disposed on the second active area.

12. The display device of claim 1, wherein a thickness of the thickest portion of the encapsulation layer positioned in the plurality of holes is greater than a thickness of the thickest portion of the encapsulation layer positioned on the plurality of light-emitting elements.

13. The display device of claim 1, wherein the encapsulation layer contacts the substrate in the plurality of holes.

14. The display device of claim 1, wherein a part of an upper portion of the substrate is removed in the plurality of holes.

15. The display device of claim 1, wherein a thickness of the substrate positioned on an area overlapping the plurality of light blocking patterns in the plurality of holes is greater than a thickness of the substrate positioned on an area other than an area overlapping the plurality of light blocking patterns in the plurality of holes.

16. A display device, comprising:
    a substrate on which a plurality of light-emitting elements are disposed, and including a first active area having a first resolution and a second active area having a second resolution lower than the first resolution;
    a light detecting sensor positioned on a rear surface of the substrate, and overlapping the second active area;
    an encapsulation layer disposed on the first active area and the second active area;
    a first touch electrode disposed on the encapsulation layer and positioned in the first active area;
    a second touch electrode disposed on the encapsulation layer and positioned in the second active area; and
    a plurality of light blocking patterns disposed on the encapsulation layer, disposed on the second active area, and disposed on a part area of an area other than area where the second touch electrode is are disposed,
    wherein each of the first touch electrode and the second touch electrode has a plurality of openings overlapping the plurality of light-emitting elements,
    wherein in the first active area, the width of the first touch electrode is constant, and in the second active area, the width of the second touch electrode is not constant.

* * * * *